Feb. 19, 1957 J. W. BECK 2,782,267

PUSH-PULL TRANSISTOR AMPLIFIER

Filed Oct. 8, 1953 2 Sheets-Sheet 1

*INVENTOR.*
JOHN W. BECK

*BY* William R. Lane

ATTORNEY

PUSH-PULL TRANSISTOR AMPLIFIER
Filed Oct. 8, 1953 2 Sheets-Sheet 2
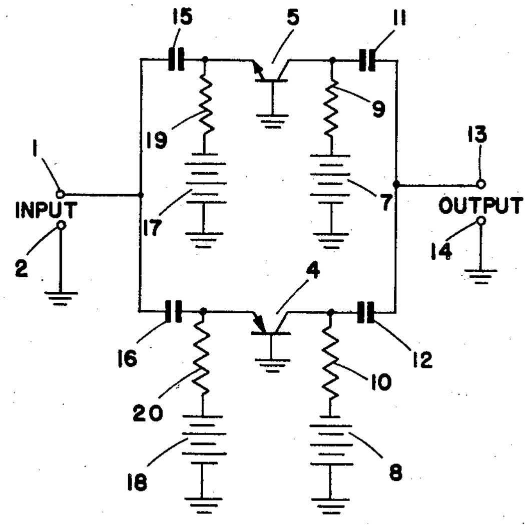
FIG. 4
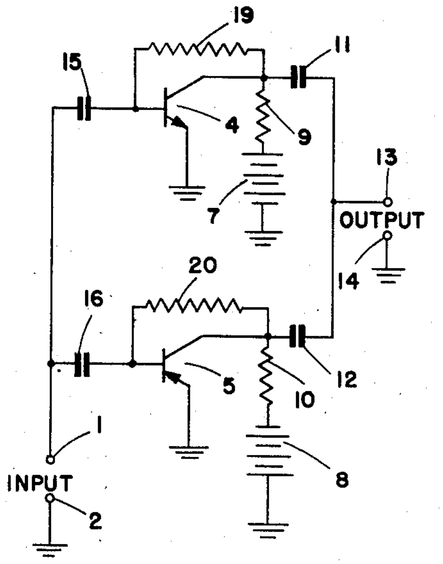
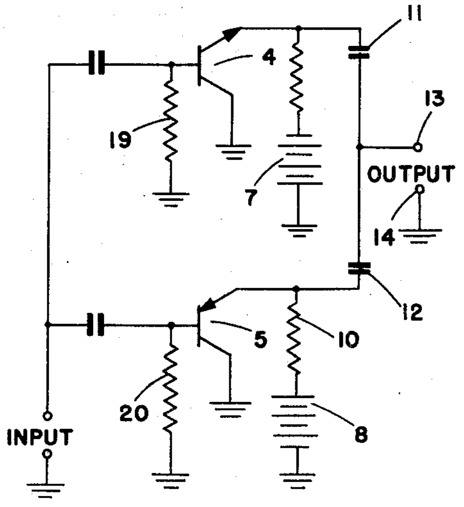
FIG. 5 FIG. 6
INVENTOR.
JOHN W. BECK
BY William R. Lane
ATTORNEY United States Patent Office 2,782,267

Patented Feb. 19, 1957

2,782,267

PUSH-PULL TRANSISTOR AMPLIFIER

John W. Beck, Huntington Park, Calif., assignor to North American Aviation, Inc.

Application October 8, 1953, Serial No. 384,831

1 Claim. (Cl. 179—171)

This invention is an untuned power amplifier using transistors and, more particularly, a push-pull amplifier using an N–P–N and P–N–P transistor.

The transistor provides several advantages over the vacuum tube in electronic circuit applications. It is compact, lightweight, and rugged. Relative to the vacuum tube, its power consumption is insignificant.

While the transistor appears as a substitute for the vacuum tube, the analogy between the two is not complete. Novel circuitry is required in order to substitute a transistor for a vacuum tube. This is necessary, among other reasons, because of the variance in characteristics between transistors.

Push-pull amplifiers incorporating tubes generally use a center-tapped input transformer or are driven by a phase inverter circuit in order that the grid of each tube is excited in opposite phase. The output of the tubes is then of opposite phase and generally requires an output transformer to receive the phase inverted output.

The device of the invention provides a stage of push-pull amplification but requires no phase inverting transformer circuits. Consequently, the advantages of push-pull amplification (e. g., less distortion and increased power output) can be retained in an amplifier having the simplicity of single-ended circuits.

It is therefore an object of this invention to provide an improved push-pull amplifier utilizing transistors.

Another object of this invention is to provide a push-pull amplifier having a single-ended input and output.

Another object of this invention is to provide a push-pull amplifier using a minimum of power.

A still further object of this invention is to provide a transistor push-pull amplifier consonant with the dissimilarity in characteristics between transistors.

Other objects of invention will become apparent from the following description taken in connection with the accompanying drawings, in which Fig. 1 is a schematic drawing of the invention;

Fig. 4 is another modification of the embodiment shown in Fig. 1 including a bias circuit;

Fig. 5 is a modification of the embodiment of Fig. 4; and,

Fig. 6 is a second modification of the embodiment of Fig. 4.

Figure 1:
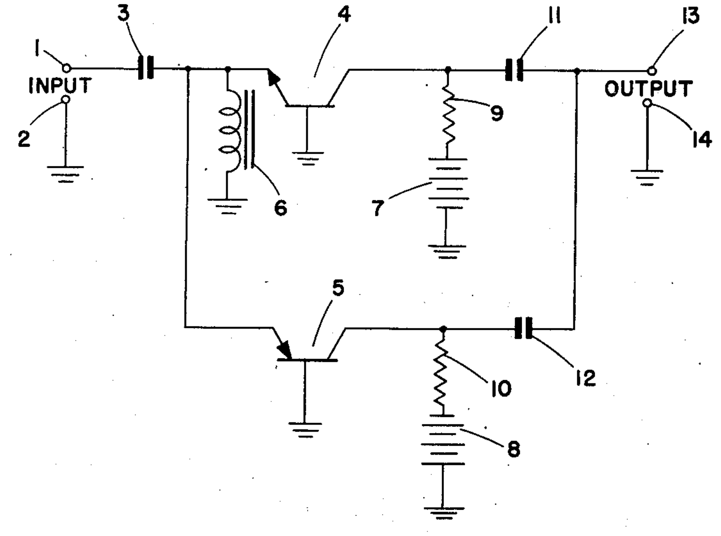

Referring now to Fig. 1, input terminals 1 and 2 receive the input signal. A single terminal 1 is connected to capacitor 3 which is connected to the emitters of transistors 4 and 5 and choke 6. Choke 6 is connected from the emitters to the bases through the ground. The collector of transistor 4 is connected to resistance 9 and capacitor 11. Resistor 9 is connected to D.-C. source 7 which is connected to ground. Capacitor 11 is connected to single output terminal 13. A grounded lead provides the other output terminal 14. Similarly, the collector of transistor 5 is connected to a resistor 10 and capacitor 12. Resistor 10 is connected to D.-C. source 8 which is connected to ground. Each transistor provides an amplification relatively independent of the collector to emitter voltage of the other. Capacitor 12 is connected to terminal 13. In Fig. 1, an A.-C. voltage is received at single-ended input terminals 1 and 2 and passes blocking capacitor 3 and is impressed between respective emitters and bases of transistors 4 and 5. Transistor 4 is an N–P–N junction transistor and, accordingly, the emitter arrow indicates the direction of conventional current flow as being from the semiconductor material of the transistor out through the emitter. Transistor 5 is a P–N–P junction transistor and, accordingly, the emitter arrow indicates the direction of conventional current flow as being from the emitter into the semiconductor material of the transistor.

The impedance from base to collector is high and, therefore, a minimum of load current flows in the embodiment of Fig. 1. Magnetic choke 6 provides a D.-C. path from the emitter of each transistor to its base, in order to hold the D.-C. bias on both emitters with respect to their bases, at zero. Each transistor is, therefore, in class B operation.

In the output circuit from the collector of transistor 4 is capacitor 11 and from the collector of transistor 5 is capacitor 12. The output terminals are then connected together to provide a single-ended output at terminals 13 and 14.

In class B operation, one transistor conducts during the positive half of the incoming signal and the other conducts during the negative half. Assuming transistor 4 is about to conduct, an A.-C. signal is received which places the bases of both transistors at a potential above their emitters. This causes the impedance from the collector to the emitter of transistor 4 to reduce considerably and greater current flow from D.-C. source 7 through the collector. The collector current flows according to the varying positive potential placed on the base with respect to the emitter. The A.-C. signal develops across resistor 9. This signal, being A.-C., passes blocking capacitor 11 and appears at output terminals 13 and 14.

As the input A.-C. signal reverses, it reduces the bases of transistors 4 and 5 to a potential below the emitter, transistor 4 ceases conducting and by reason of its nature, transistor 5 commences conduction, and current flows from source 8 through resistor 10. The current in transistor 5 follows the varying A.-C. signal placed on its base and this A.-C. wave passes blocking capacitor 12 and appears across output terminals 13 and 14. The output from the combined transistors is thus full-wave.

Magnetic choke 6 provides a D.-C. path to ground in both emitter circuits and insures that each transistor operates with zero bias between base and emitter.

Figure 2:
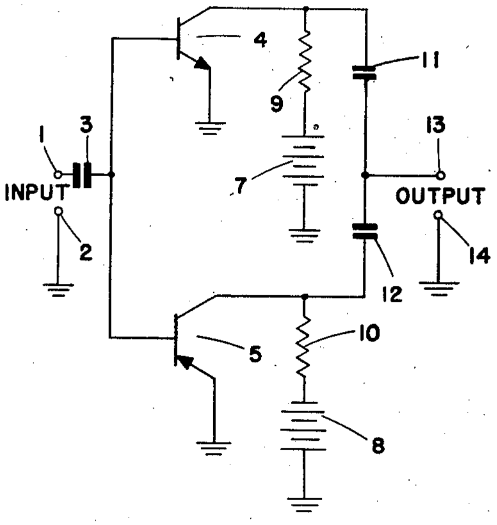
Fig. 2 is a modification of the embodiment shown in Fig. 1.

Fig. 2 is the embodiment of Fig. 1 but indicates a relative change of transistor connections. The input signal is received between base and emitter at each transistor, but the output circuit is between the collector and emitter. Resistors 9 and 10 are for the purpose of fixing the collector D.-C. potential.

Figure 3:
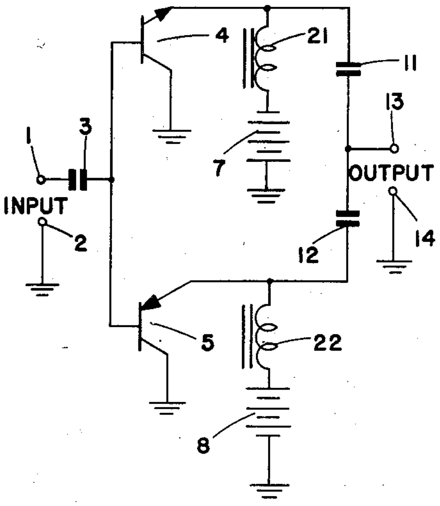
Fig. 3 is a second modification of the embodiment shown in Fig. 1.

Fig. 3 is a second embodiment of Fig. 1 and indicates a further relative change of transistor connections. The input signal is received between the collector and base at each transistor (a relatively high impedance input) and the output circuit is between emitter and collector.

The choke coil 6 of Fig. 1 may be incorporated in Figs. 2 and 3, connected between emitters and bases.

The resistances 9 and 10 in Fig. 1 may be replaced by magnetic inductances 21 and 22 as shown in Fig. 3.

Fig. 4 indicates a single-ended input having separate signal input paths to each transistor through capacitors 15 and 16. In this way, class A or class A—B operation may be obtained. The transistors can then be separately biased by means of D.-C. sources 17 and 18, and resistances 19 and 20, as shown.

Figs. 5 and 6 are modifications of Fig. 4 in which the relative connections of the transistors are rotated. In these figures, the emitter-to-base current is established, whereas, in Figs. 1, 2, and 3, the emitter-to-base potential is established.

Although the invention has been described and illustrated in detail, it is to be clearly understood that the same is by way of illustration and example only and is not to be taken by way of limitation, the spirit and scope of this invention being limited only by the terms of the appended claim.

I claim:

In a push-pull amplifier, a single-ended A.-C. input circuit, a N–P–N transistor and a P–N–P transistor similarly connected to said A.-C. input circuit, a point of common reference potential connected to a similar electrode of each said transistor and common to said input circuit and D.-C. bias means including a separate D.-C. source and load impedance connected in series between said point and the output electrode of each said transistor, both of the junctions of the output electrodes with their respective load impedances being capacitively coupled to a single common output terminal, whereby each transistor has its own complete and separate direct current bias path but contributes alternating current output to the common output terminal between which and said reference point an output load may be connected.

References Cited in the file of this patent

UNITED STATES PATENTS

| | | |
|---|---|---|
| 2,666,818 | Shockley | Jan. 19, 1954 |
| 2,666,819 | Raisbeck | Jan. 19, 1954 |

OTHER REFERENCES

"Electronics" Magazine, January 1953, pp. 5 and 6; September 1953, pp. 140–143.

Sziklai article, Proc. of I. R. E., June 1953, pp. 717–720.